United States Patent [19]

Lee

[11] Patent Number: 5,486,786
[45] Date of Patent: Jan. 23, 1996

[54] PROCESS MONITOR FOR CMOS INTEGRATED CIRCUITS

[75] Inventor: Teh-Kuin Lee, San Jose, Calif.

[73] Assignee: LSI Logic Corporation, Milpitas, Calif.

[21] Appl. No.: 287,653

[22] Filed: Aug. 9, 1994

[51] Int. Cl.$^6$ .......................... H03K 17/14; H03K 9/08
[52] U.S. Cl. .............. 327/378; 327/35; 327/38; 327/175
[58] Field of Search ................... 327/31, 35, 38, 327/175, 262, 378; 331/57, 65

[56] References Cited

U.S. PATENT DOCUMENTS

| | | | |
|---|---|---|---|
| 4,710,653 | 12/1987 | Yee | 327/38 |
| 5,019,782 | 5/1991 | Schatter | 331/65 |
| 5,068,547 | 11/1991 | Gascoyne | 307/443 |
| 5,359,301 | 10/1994 | Candage | 331/57 |
| 5,365,204 | 11/1994 | Angiulli et al. | 331/57 |

*Primary Examiner*—Margaret Rose Wambach
*Attorney, Agent, or Firm*—Poms, Smith, Lande & Rose

[57] ABSTRACT

A process monitor for a CMOS integrated circuit includes first and second delay units that are connected in a ring to constitute a ring oscillator that generates pulses having different phases at the outputs of the delay units respectively. The delay units affect the frequency of the pulses and also the rising and falling edges of the pulses differently depending on the process factor of PMOS and NMOS transistors in the delay units. The process factor can be computed from the frequency, or the ratio of the phase differences between the rising and falling edges of the pulses at the outputs of the first and second delay units. The oscillatory configuration of the monitor is highly sensitive to variations in process factor, and enables the monitor to be embodied by a relatively small number of elements that can fit in two input/output slots in a standard integrated circuit layout.

29 Claims, 6 Drawing Sheets

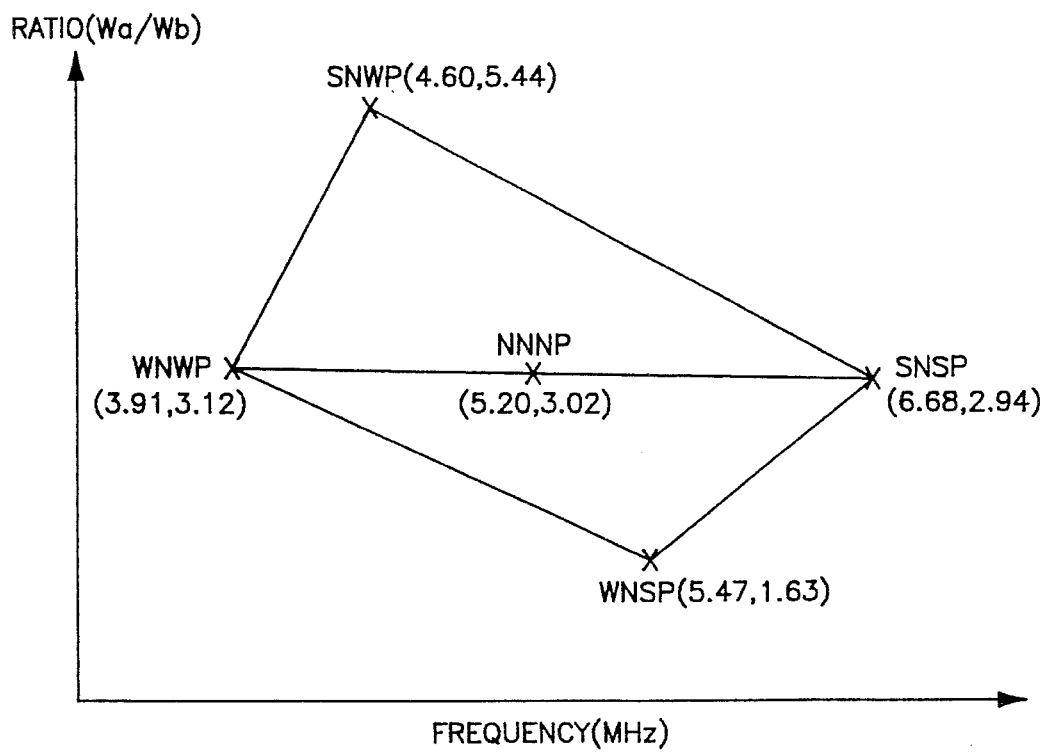
Fig.6
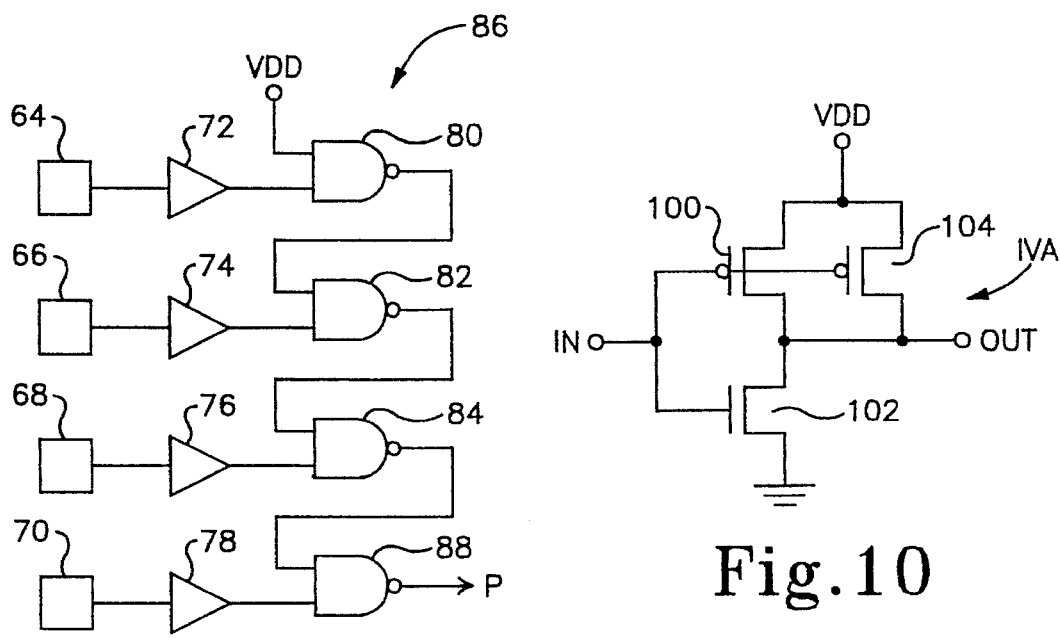
Fig.8
Fig.10

PROCESS MONITOR FOR CMOS INTEGRATED CIRCUITS

BACKGROUND OF THE INVENTION

1. Field of the Invention

The present invention generally relates to the art of microelectronic integrated circuits, and more specifically to process monitor for CMOS integrated circuits.

2. Description of the Related Art

Fabrication of Complementary-Metal-Oxide-Semiconductor (CMOS) integrated circuits involves a large number of process steps that affect the N-type or NMOS transistors and other NMOS devices differently than P-type or PMOS devices. In order for the integrated circuit to operate properly, the relative electrical characteristics of the NMOS and PMOS devices must be within specified ranges. The relative qualities of the NMOS and PMOS devices, measured in terms of a figure of merit, is known in the art as the "process factor". Typically, the figure of merit is the switching speed of the device.

There are numerous parameters that can be varied during fabrication to cause NMOS devices to have higher merit, or be stronger, than PMOS devices and vice-versa. For this reason, a process monitor is integrally fabricated with each integrated circuit, and includes NMOS and PMOS transistors that are identical to those in the functional or logical devices of the circuit. The process monitor is preferably accessible via the standard input/output (I/O) pins of the integrated circuit, and enables measurement of the process factor of the circuit at various stages of the fabrication process.

For testing the process factor for a production run of integrated circuits, a set of test circuits are fabricated in which the processing parameters are varied in a known manner to produce the test circuits as having different process factors. The parameters are varied to produce at least one integrated circuit having strong NMOS and weak PMOS transistors (SNWP), weak NMOS and strong PMOS (WNSP) transistors, strong NMOS and strong PMOS (SNSP) transistors and weak NMOS and weak PMOS (WNWP) transistors.

The process factors of the test circuits are measured and plotted as illustrated in FIG. 1. The Y axis represents variation of fabrication parameters to selectively produce stronger NMOS transistors, whereas the X axis represents variation to selectively produce stronger PMOS transistors.

The four corners of the graph at SNWP, WNSP, SNSP and WNWP constitute the conceptual limits of process variation for the four extreme combinations of NMOS and PMOS transistors. In order to produce a CMOS integrated circuit with NMOS and PMOS transistors having the proper balance, the actual process factors for the set of test circuits must lie within a "region of acceptability" 10 as indicated by hatching in the drawing.

U.S. Pat. No. 5,068,547, entitled "PROCESS MONITOR CIRCUIT", issued Nov. 26, 1991 to William H. Gascoyne, is assigned to LSI Logic Corporation of Milpitas, CA, the assignee of the present invention. This patent discloses a monitor circuit for measuring the process factor for a production run of CMOS integrated circuits as discussed above.

The main elements of Gascoyne's monitor, designated as 12, are illustrated in FIG. 2. The monitor 12 comprises a delay unit 14 (delay unit A) and a delay unit 16 (delay unit B) that have inputs connected to receive input test pulses P.

The delay units 14 and 16 produce output pulses, designated as A and B, that are applied to inputs of an exclusive-OR gate 18 (equivalent results can be produced by replacing the gate 18 with an exclusive-NOR gate). The gate 18 produces a logically high output when the logical senses of the pulses A and B are different, and a logically low output when the logical senses of the pulses A and B are the same.

The delay units 14 and 16 are configured to alter the input pulses P to produce the output pulses A and B differently depending on the process factor of the integrated circuit under test, thereby enabling measurement of the process factor of the test set of integrated circuits.

More specifically, due to the slower carrier mobility of PMOS transistors as compared to NMOS transistors, certain types of CMOS logic gates, such as NOR gates, produce output pulses in response to input pulses in which the rising (positive-going) edges are sharper (delayed less) than the falling (negative-going) edges.

This causes the falling edges of the output pulses from a CMOS NOR gate to be delayed relative to the rising edges of input pulses by a longer period of time than the falling edges. This is due to the fact that the pull-up transistors in a CMOS NOR gate are PMOS, whereas the pull-down transistors are NMOS. The PMOS pull-up transistors pull up to the logically high level slower than the NMOS pull-down transistors pull down to the logically low level, thereby creating rising edge delays that are longer than falling edge delays.

The delay unit 16 comprises a chain of gates, preferably inverters, that differ from the above discussed NOR gates in that they have symmetrical rising and falling edges. In other words, the rising and falling edges are delayed by the same period of time. The purpose of the delay unit 16 is to provide a reference delay period such that the pulses B have essentially the same waveform as the input pulses P, but are delayed by a predetermined period of time.

The delay unit 14 comprises a chain of delay elements having the asymmetrical edge delay characteristics discussed above such that the rising edges are delayed more than the falling edges. Typically, the delay unit 14 comprises a chain of alternating NOR gates and inverters. There are more devices in the delay unit 14 than in the delay unit 16, such that the pulses A are delayed longer than the pulses B.

The operation of the prior art process monitor 12 is illustrated in the timing diagram of FIG. 3. The input pulses P have a period designated as Tin. The output pulses B from the delay unit 16 are delayed by a fixed length of time T1 from the respective input pulses P, and have a period Ta which is substantially equal to the period Tin of the input pulses P.

The output pulses A from the delay unit 14 have rising edges that are delayed by a length of time T2 from the respective input pulses P. The exclusive-OR gate 18 produces a logically high output when its inputs are different. Thus, the gate 18 produces an output signal OUT that is high during a period Wa between the rising edges of the output pulses A and B.

The falling edges of the output pulses B occur before the falling edges of the output pulses A, with the difference being a period Wb. The output signal OUT produced by the gate 18 is logically high during this time since the logical senses of the pulses A and B are different as described above.

The process factor is generally computed as being equal to the ratio of the periods Wa and Wb (Wa/Wb), although it can be subjected to normalization or other computation as described in the patent to Gascoyne.

Since the rising edges of the pulses A are affected by the strength of the PMOS transistors in the delay unit 14, the period Wa will increase as the strength of the PMOS transistors decreases, and vice-versa. The falling edges of the pulses A are affected by the strength of the NMOS transistors in the delay unit 14, and the period Wb will increase as the strength of the NMOS transistors decreases, and vice-versa. The graph of FIG. 1 is typically derived by plotting the ratio Wa/Wb on the vertical axis, and the average edge delay period [(rising edge delay period +falling edge delay period)/2] on the horizontal axis.

A major problem with the prior art process monitor 12 is that it is relatively insensitive to variations in process factor. For this reason, the delay units 14 and 16 must each comprise a very large number of gates in order to produce delay periods Wa and Wb that are sufficiently long to be accurately measured using currently available instrumentation.

The prior art process monitor requires so many gates that it typically occupies two input/output slots in a standard CMOS integrated circuit layout, in addition to substantial space in the core area of the layout. This limits the amount of space available for the actual logical circuitry of the CMOS integrated circuit.

In addition, the many gates of the process monitor 12 consume a large amount of power. This requires that a larger power supply be provided, or that the logical circuitry of the integrated chip be limited to provide the power required by the process monitor.

SUMMARY OF THE INVENTION

A process monitor for a CMOS integrated circuit in accordance with the present invention includes first and second delay units that are connected in a ring to constitute a ring oscillator that generates pulses having different phases at the outputs of the delay units respectively. The delay units affect the frequency of the pulses and also the leading and trailing edges of the pulses differently depending on the process factor of PMOS and NMOS transistors in the delay units.

The process factor can be computed from the frequency, or the ratio of the phase differences between the leading and trailing edges of the pulses at the outputs of the first and second delay units.

The oscillatory configuration of the present process monitor is highly sensitive to variations in process factor, enabling the monitor to be embodied using a much smaller number of gates than the prior art process monitor described above. This enables the present process monitor to fit into two input/output slots in a standard CMOS integrated circuit layout, thereby freeing the entire core area of the circuit for actual logical circuitry.

The reduced size of the present process monitor also results in reduced power consumption, and it can be powered from a standard CMOS integrated circuit power supply. As another benefit of the present invention, the oscillatory configuration eliminates the necessity for external test pulses as are required in the prior art process monitor.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 6 is a graph illustrating a process factor for a CMOS integrated circuit as sensed and calculated using the process monitor of FIG. 4;

FIG. 8 is an electrical schematic diagram illustrating a NAND gate tree of the process monitor of FIG. 7;

FIG. 10 is an electrical schematic diagram illustrating an inverter element of the process monitor illustrated in FIG. 9;

DETAILED DESCRIPTION OF THE INVENTION

Figure 4:
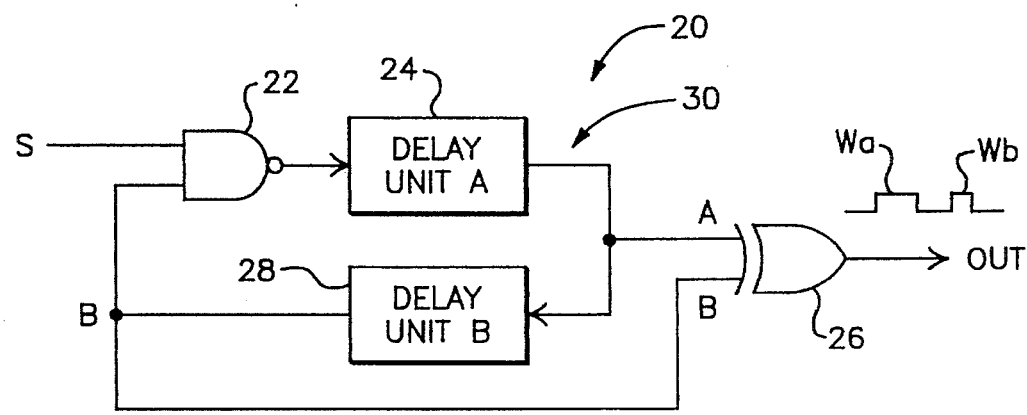
FIG. 4 is a block diagram illustrating a CMOS process monitor embodying the present invention.

As illustrated in FIG. 4 of the drawings, a CMOS process monitor embodying the present invention is generally designated by the reference numeral 20. A select signal S is applied to an input of a NAND gate 22, the output of which is connected to an input of a delay unit 24 (delay unit A). The delay unit 24 produces output pulses A, which are applied to an input of an exclusive-OR gate 26.

The pulses A are also applied to an input of a delay unit 28 (delay unit B), the output of which is connected to another input of the NAND gate 22. The output of the delay unit 28 is also connected to another input of the exclusive-OR gate 26. Output pulses OUT are generated at the output of the exclusive-OR gate 26.

The delay unit 24, delay unit 28 and NAND gate 22 are connected serially in a ring configuration to constitute a ring oscillator 30. The oscillator 30 is enabled by applying a logically high select signal S to an input of the NAND gate 22. This causes the NAND gate 22 to function as an inverter.

The inverter, connected in a serial ring configuration with the delay units 24 and 28, produces self oscillation at a frequency $F=\frac{1}{2} T_D$, where $T_D$ is the total delay of the delay units 24 and 28. If the select signal S is made logically low, the NAND gate 22 is inhibited, and the oscillator 30 will not oscillate.

As will be described in detail below, the delay unit 24 comprises a chain of delay stages that are configured to delay the rising edges of pulses in the oscillator 30 more than the falling edges of the pulses. The delay unit 28 can be configured to introduce equal delays to the rising and falling edges of the pulses, but is more preferably configured to delay the falling edges of the pulses more than the rising edges thereof.

Figure 5:
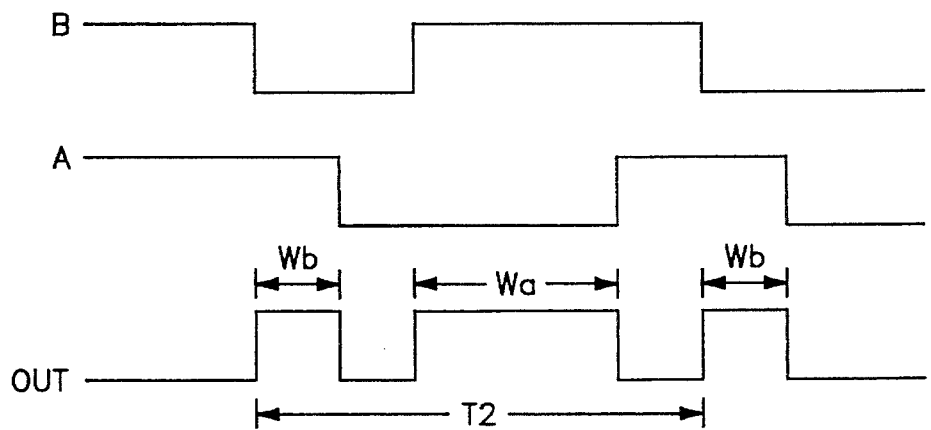
FIG. 5 is a timing diagram illustrating the operation of the circuit of FIG. 4.

The operation of the process monitor 20 is illustrated in FIG. 5. The output pulses A and B of the delay units 24 and 28 have different phases, which depend on the delays introduced by these units. As illustrated in FIG. 5, the output pulses OUT have a total period T, including logically high periods Wa and Wb as described above with reference to FIG. 3. More specifically, the rising edges of the pulses B occur first. The rising edges of the pulses A appear after those of the pulses B, such that the exclusive-OR gate 26 produces a logically high output during the period Wa that the logical senses of the pulses A and B are different.

In an essentially similar manner, the falling edges of the pulses B occur before those of the pulses A, and the exclusive-OR gate 26 produces a logically high output during a period Wb in which the logical senses of the pulses of A and B are different.

Since the delay unit 24 delays the rising edges of the pulses longer than the falling edges thereof, the rising edges of the pulses A will occur at a relatively later time than those of the pulses B as the strength of the PMOS transistors in the delay unit 24 decreases. This causes the period Wa to increase.

In an essentially similar manner, the trailing edges of the pulses B will occur at a relatively longer length of time from the rising edges thereof as the strength of the NMOS transistors in the delay unit 28 decreases. This causes the period Wb to increase.

The frequency of the pulses produced by the oscillator 30, which are the reciprocal of the period T illustrated in FIG. 5, vary in accordance with the strengths of the PMOS and NMOS transistors in the oscillator 30. Generally, the frequency of the pulses will increase as the strength of either or both of the NMOS and PMOS transistors increase. Thus, the frequency of the oscillator 30 can be used as a parameter for computation of the process factor of the integrated circuit in which the process monitor 20 is provided.

The actual function for computing the process factor as a function of oscillator frequency depends on a particular application, and will generally be determined empirically.

A computer simulation was performed to illustrate the relationships between the periods Wa and Wb, the oscillator frequency F and the process factor for an exemplary integrated circuit chip which is represented by the ratio Wa/Wb. These results are illustrated in FIG. 6 and tabulated in the following table. It will be noted that the frequency F is a reciprocal of the period T.

TABLE

| TEST CHIP | WIDTH Wa (ns) | WIDTH Wb (ns) | RATIO Wa/Wb | PERIOD T (ns) | FREQUENCY F (Mhz) |
|---|---|---|---|---|---|
| NNNP | 76.35 | 25.27 | 3.02 | 192.30 | 5.20 |
| WNWP | 108.54 | 34.76 | 3.12 | 255.73 | 3.91 |
| SNSP | 55.05 | 18.71 | 2.94 | 149.59 | 6.68 |
| SNWP | 103.42 | 19.01 | 5.44 | 217.36 | 4.60 |
| WNSP | 57.54 | 35.35 | 1.63 | 182.65 | 5.47 |

In addition to the extreme cases WNWP, SNSP, SNWP and WNSP, an exemplary set of values were provided for a nominal case NNNP, in which the NMOS and PMOS transistors have nominal or normal values. As illustrated in FIG. 6, the NNNP case appears at the center of the graph. In FIG. 6, the vertical axis represents the process factor Wa/Wb, whereas the horizontal axis represents the oscillator frequency F in megahertz.

The nominal case NNNP produces a period Wa of 76.35 nanoseconds, a width Wb of 25.27 nanoseconds, and a process factor or ratio Wa/Wb of 3.02. The corresponding period T is 192.3 nanoseconds, whereas the frequency is 5.2 megahertz.

For the WNWP case, the width Wa is increased to 108.54 nanoseconds due to the rising edge delay caused by the weak PMOS transistors in the delay unit 24. The period Wb is also increased to 34.76 nanoseconds due to the increased falling edge delay introduced by the delay unit 28. The ratio Wa/Wb is increased to 3.12, whereas the frequency of the oscillator 30 is decreased to 3.91 megahertz.

The SNSP is the opposite of the WNWP case, with the width Wa being reduced to 55.05 nanoseconds and the width Wb being reduced to 18.71 nanoseconds. The ratio Wa/Wb drops to 2.94, whereas the frequency F increases to 6.68 megahertz.

The SNWP case produces a width Wb which is approximately equal to that of the SNSP case. However, the period Wa is increased from 55.05 to 103.42. This is again due to the increased rising edge delay caused by the weak PMOS transistors in the delay unit 24.

The WNSP case produces a period Wa that is approximately equal to that of the SNSP case. However, the period Wb is increased from 18.71 to 35.35 nanoseconds. The ratios Wa/Wb and the frequencies F for these cases vary accordingly in the manner described above.

Due to the oscillatory nature or configuration of the present process monitor 20, the sensitivity is substantially increased over the prior art process monitor, and a much smaller number of delay elements or stages are required to produce the delays and periods Wa and Wb necessary to provide accurate measurement of the process factor.

The strong oscillations produced by the ring oscillator 30 substantially increase the separation between the values for the SNWP and WNSP cases over the prior art, with the NNNP, WNWP and SNSP values being close together. The reduction in the number of gates required to implement the present process monitor 20 enables the entire monitor 20 to fit into two input/output slots of a standard CMOS integrated circuit layout.

In contrast to the prior art, no portion of the process monitor is required to be located in the core area of the CMOS integrated circuit layout. This enables the entire core area to be utilized for the actual logical functions of the integrated circuit.

In addition, the oscillation of the ring oscillator 30 can be stopped by applying a logically low select signal S to the NAND gate 22. This reduces the power consumption of the process monitor 20 to a negligible value when the monitor is not being used. In addition, since the circuit 30 self oscillates, no test input pulses are required to be applied to the process monitor 20 from an external source as are required in the prior art.

Figure 1:
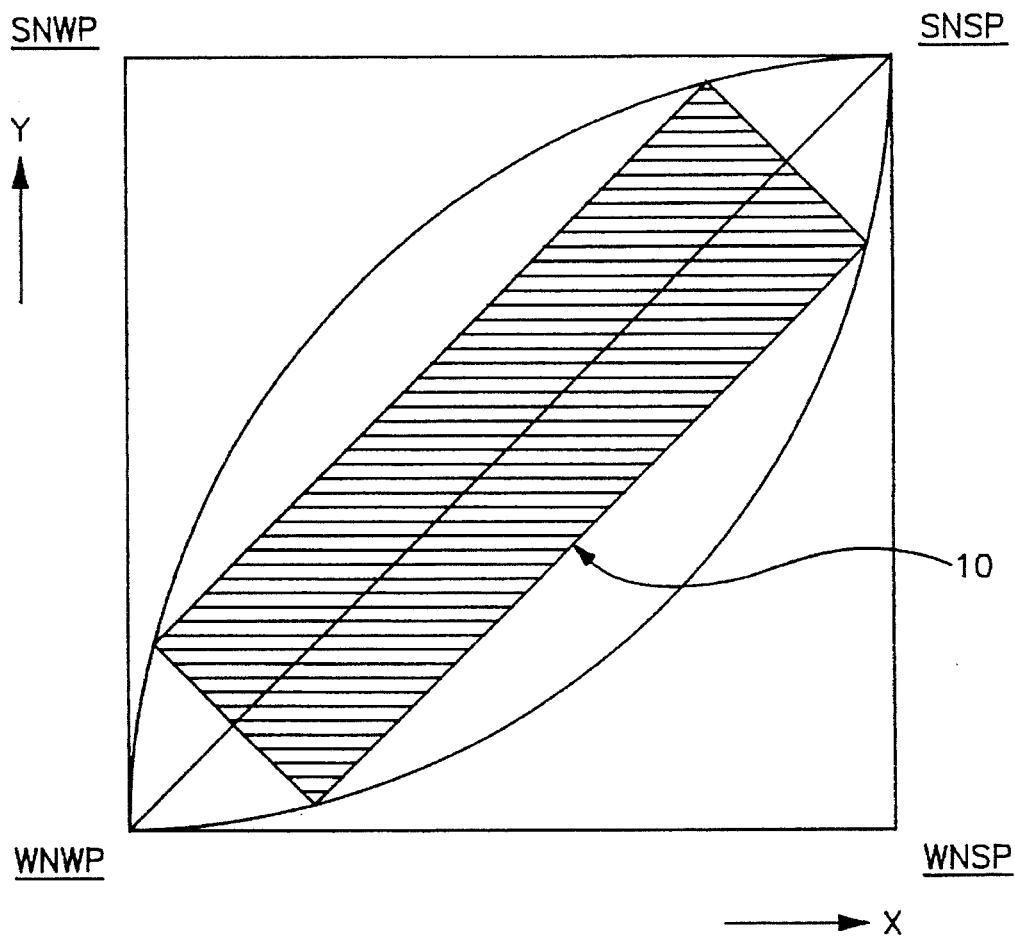
FIG. 1 is a graph illustrating the process factor of a CMOS integrated circuit.
Figure 2:
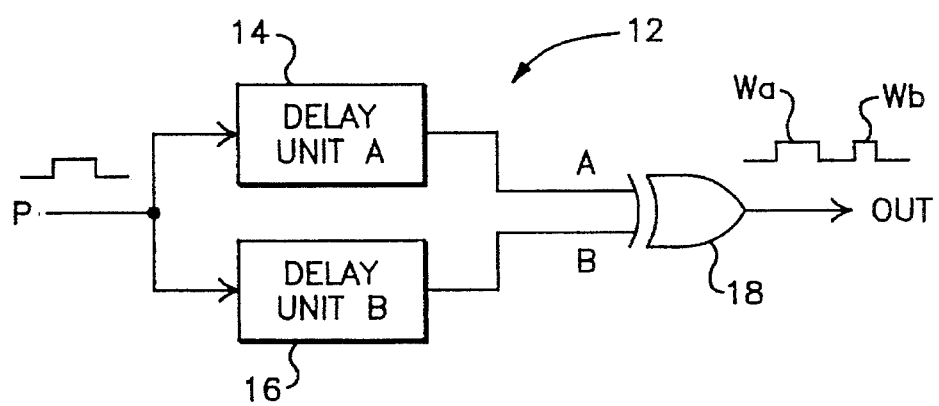
FIG. 2 is a block diagram illustrating a prior art CMOS process monitor.
Figure 3:
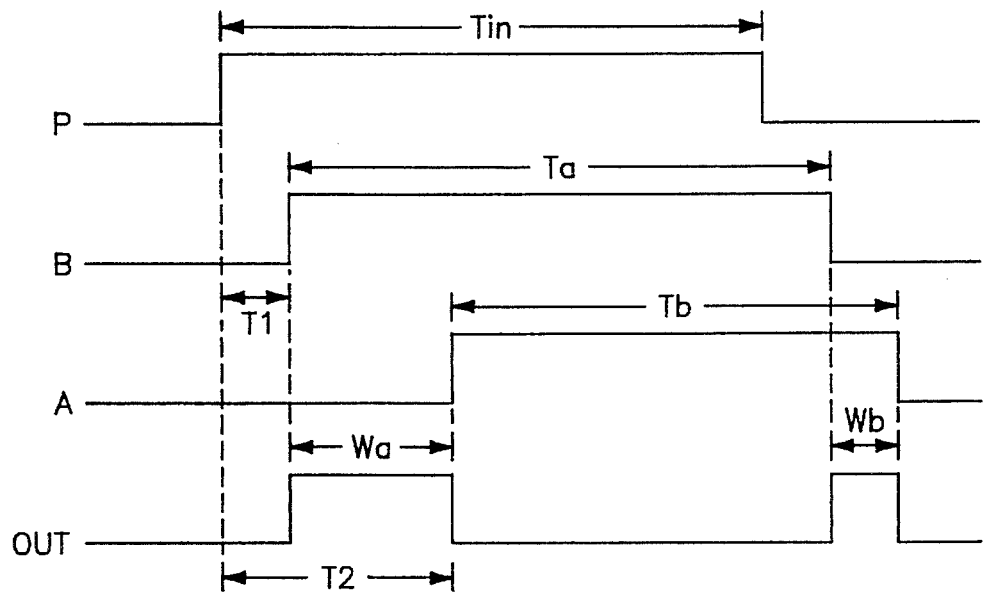
FIG. 3 is a timing diagram illustrating the operation of the circuit of FIG. 2.

In certain applications, it is desirable to provide the present CMOS process monitor 20 with the additional functionality of the prior art process monitor described with reference to FIGS. 1 to 3. This can be accomplished utilizing the implementation illustrated in FIG. 7, in which like elements are designated by the same reference numerals used in FIG. 4.

A CMOS integrated circuit 32 embodying the present invention comprises a semiconductor substrate 34. The present CMOS process monitor 20, in addition to CMOS logic circuitry 36 which implements the actual logical functionality of the integrated circuit 32, are integrally fabricated on the substrate 34.

The process monitor 20 and the logic circuitry 36 include NMOS and PMOS transistors and gates having identical characteristics. Therefore, a process factor for the integrated circuit 32 which is measured by the present process monitor 20 accurately reflects the electrical characteristics of the NMOS and PMOS transistors in the logic circuitry 36 as well as those in the process monitor 20.

In addition to the elements described above with reference to FIG. 4, the integrated circuit 32 comprises an output terminal 38 which is connected to an external processor 40. An output of the processor 40 is connected to a display unit 42.

The processor 40 and display unit 42 can be constituted by a general purpose digital computer, or can be a specialized test instrument. The processor 40 receives the output pulses from the process monitor 20, senses the required parameters of the pulses, and calculates the process factor for the integrated circuit 32 as a predetermined function of the parameter.

As described above, the process factor can be calculated as a predetermined function of the frequency of the pulses OUT. Alternatively, the process factor can be calculated as a ratio Wa/Wb, a normalized version of the ratio Wa/Wb, a combination of the frequency and the ratio Wa/Wb, or any other function which is predetermined to produce an accurate calculation of the process factor upon sensing of the output signals from the process monitor 20. The results of the processing can be visually indicated on the display unit 42 and/or printed out to provide a hard copy.

The integrated circuit 32 further comprises an input terminal 44 for receiving the select signal S, and input terminals 46 and 48 for receiving input test pulses P as described above with reference to FIGS. 1 to 3, and an enable signal E respectively.

The select signal S is applied from the terminal 44 to the input of the NAND gate 22 as described above. The test pulses P are applied from the terminal 46 to an input of an AND gate 50, the output of which is connected to an input of an OR gate 52. The output of the OR gate 52 is connected to an input of the NAND gate 22.

The enable signals E are applied from the terminal 48 to the input of an inverter 54, the output of which is connected to an input of an AND gate 56. The output of the AND gate 56 is connected to an input of the OR gate 52. The enable signal E is also applied directly to another input of the AND gate 50.

In accordance with this embodiment of the present invention, the output pulses B from the delay unit 28 are applied to another input of the AND gate 56, rather than being applied directly to an input of the NAND gate 22.

The output of the exclusive-OR gate 26, which produces the output signals OUT, is connected to an input of multiplexer 58. A logical output N from the CMOS logic circuitry 36 is connected to another input of the multiplexer 58. As will be described in detail below, this arrangement enables the standard input/output pins of the integrated circuit 32 to be selectively utilized for controlling and receiving the outputs from the process monitor 20.

The output of the multiplexer 58 is connected through an output buffer 60 to the terminal 38. The signals that appear at the terminal 38 and are applied to the processor 40 are designated as OUT'. The select signal S is connected to a control input of the multiplexer 58.

The integrated circuit 32 can be operated in several different modes under control of the select signal S and the enable signal E. When the select signal S is logically low, the integrated circuit 32 is operated in a normal mode in which a normal circuit output of the logic circuitry 36, as indicated at N, is passed through the multiplexer 58 and buffer 60 to the output terminal 38.

Figure 7:
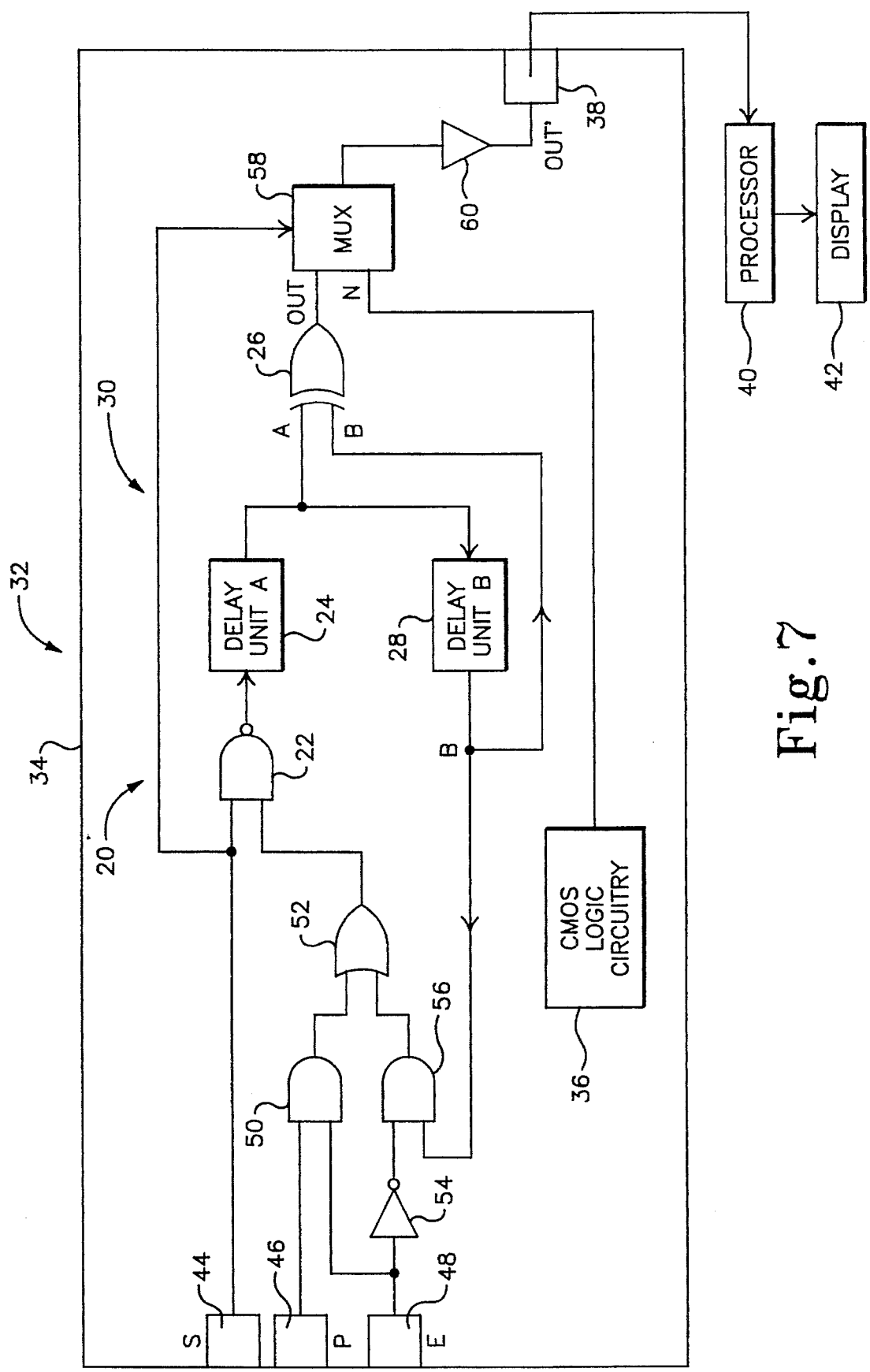
FIG. 7 is a schematic diagram illustrating the present CMOS process monitor in more detail.

Although not explicitly illustrated in FIG. 7, the output terminal 38 is also connected to an external device which receives the signal N from the CMOS logic circuitry 36 as an input. Thus, the terminal 38, which is a standard input/output terminal of the integrated circuit 32, can be used to produce either a normal output signal N from the logic circuitry 36 or test pulses OUT from the process monitor 20 as the signal OUT'

When the select signal S is logically low, the NAND gate 22 is inhibited, which opens the serial chain of the ring oscillator 30. Thus, the process monitor 20 is disabled, and dissipates only a negligible amount of electrical power.

The integrated circuit 32 can be operated in one of two selected test modes by making the select signal S logically high. This enables the NAND gate 22, so that the output of the OR gate 52 can be passed therethrough to the delay unit 24.

The integrated circuit 32 is operated in the preferred oscillatory test mode of the process monitor 20 by making the enable signal E logically low while maintaining the select signal S logically high. The logically low enable signal E inhibits the AND gate 50, such that the input test pulses P cannot be applied from the terminal 46 to the OR gate 52.

Conversely, the logically low enable signal E is inverted by the inverter 54 and applied to an input of the AND gate 56, thereby enabling the AND gate 56 to pass the pulses B therethrough to the OR gate 52 and the NAND gate 22. In this manner, the ring oscillator circuit is completed from the NAND gate 22, through the delay units 24 and 28, the AND gate 56, the OR gate 52 and back to the NAND gate 22. In this mode of operation, the process monitor 20 operates in the manner described above with reference to FIGS. 4 to 6.

The integrated circuit 32 can be operated in the manner described above with reference to prior art FIGS. 1 to 3 by making the enable signal E logically high and maintaining the select signal S also logically high. The logically high enable signal E enables the AND gate 50, such that the input test pulses P can be passed through the AND gate 50 and OR gate 52 to the NAND gate 22.

The logically high enable signal E is inverted by the inverter 54 and inhibits the AND gate 56, which prevents the pulses B from being applied to the input of the NAND gate 22. This breaks the ring oscillator chain, and prevents the oscillator 30 from sustaining oscillation.

In this mode of operation, the delay units 24 and 28 are serially chained together between the NAND gate 22 and the exclusive-OR gate 26. The configuration is essentially similar to that illustrated in FIG. 2, whereby the delay unit 24 produces output pulses A, and the delay unit B produces output pulses B, with the pulses A and B being applied to the exclusive-OR gate 26.

This operation is fundamentally different from that of the present invention as described with reference to FIGS. 4 to 6, since the ring oscillator 30 does not oscillate. Although the operation in this mode is inferior to that using the present method as described with reference to FIGS. 4 to 6, it provides the prior art capability built into the integrated circuit 32 for users who do not have a processor 40 and display 42 which are capable of processing the output signals produced in accordance with the preferred method, or for some other reason prefer to use the prior art method.

As illustrated in FIG. 8, the circuitry of FIG. 7 can be further adapted to test the functionality of standard integrated circuit input buffers. More specifically, the integrated circuit 32 is provided with standard input terminals 64, 66, 68, and 70 which are connected to input buffers 72, 74, 76 and 78, having outputs that are connected to inputs of NAND gates 80, 82, 84 and 88 respectively.

Although not explicitly illustrated, the input terminals 64, 66, 68 and 70 are also connected through the respective buffers 72, 74, 76 and 78 to inputs of the CMOS logic circuitry 36, thereby functioning as input terminals for the functional circuitry in the circuitry 36.

A positive (logically high) power supply voltage VDD is connected to another input of the NAND gate 80. The output of the NAND gate 80 is connected to another input of the NAND gate 82, the output of the NAND gate 82 is connected to another input of the NAND gate 84, whereas the output of the NAND gate 84 is connected to another input of the NAND gate 88.

The output pulses P appear at the output of NAND gate 88. In this configuration, the terminal 46 illustrated in FIG. 7 is omitted, and the test pulses P are selectively applied to one of the terminals 64, 66, 68 and 70.

The integrity of the input buffers 72, 74, 76 and 78 is tested by applying test pulses P to the respective input terminal 64, 66, 68 or 70 and analyzing the signals appearing at the output terminal 38 using the processor 40 and 42.

The input pulses P are applied to the input terminal corresponding to the buffer to be tested. The NAND gates 80, 82, 84 and 88 constitute a NAND gate tree 86, as described in the above-referenced patent to Gascoyne. Suitable voltages are applied to the other terminals to enable the test pulses P to propagate from the input terminal through the respective buffer and down through the NAND gates in the tree 86 to the output of the NAND gate 88.

For example, if the buffer 74 is desired to be tested, the input pulses P are applied to the terminal 66. These pulses propagate through the buffer 74 and are applied to the input of the NAND gate 82. Logically high signals are applied to the terminals 68 and 70 to enable the NAND gates 84 and 88. A logically low signal is applied to the terminal 64 to inhibit the NAND gate 80, and prevent the output of the NAND gate 80 from affecting the input signals applied to the NAND gate 82.

The low signal applied to the terminal 64 also prevents the test signals from being affected by any additional NAND gates that might be connected above the NAND gate 80 in an application in which more than four input terminals are provided.

The internal configuration of the delay units 24 and 28 depends upon the particular application, and is preferably designed using a computer design program such as SPICE.

Figure 9:
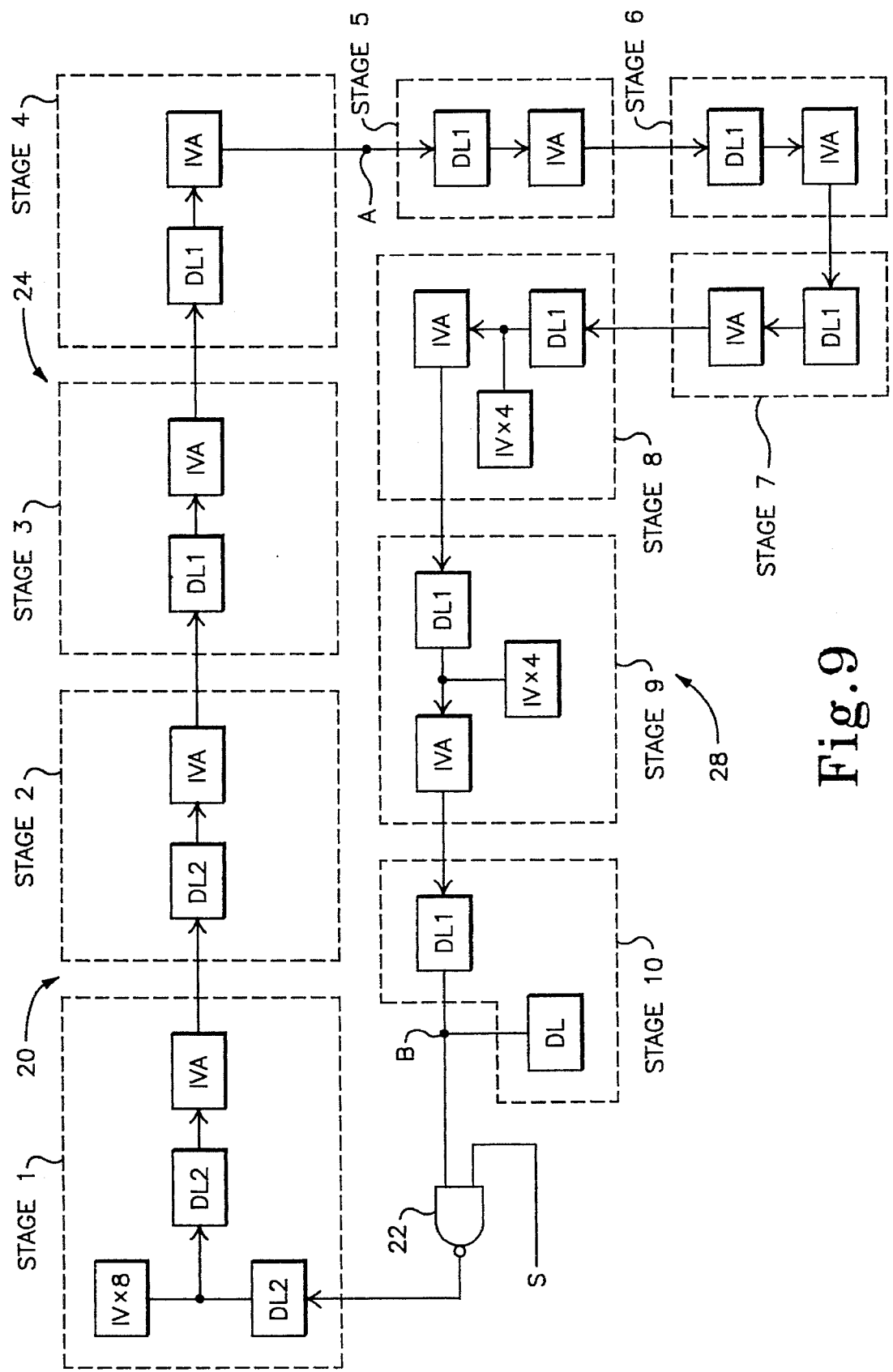
FIG. 9 is a block diagram illustrating a more detailed circuit configuration of the present process monitor.

A specific implementation of the present process monitor 20 is illustrated in FIG. 9. The delay unit 24 comprises four delay stages designated as STAGE 1, STAGE 2, STAGE 3, AND STAGE 4. STAGE 1 comprises a delay element DL2, having an input connected to the output of the NAND gate 22. The output of the delay element DL2 of STAGE 1 is connected serially through another delay element DL2 and an inverter IV1 to a delay element DL2 of STAGE 2.

A loading element consisting of eight inverters IV connected in parallel is connected to the junction of the output of the first delay element DL2 and the second delay element DL2 of STAGE 1.

STAGE 2 of the delay unit 24 comprises the delay element DL2, and an inverter IVA which has the same configuration as the inverter IVA of STAGE 1. The output of the inverter IVA of STAGE 2 is connected to a delay element DL1 of STAGE 3, the output of which is connected to an inverter IVA. The output of the inverter IVA of STAGE 3 is connected to an input of a delay element DL1 of STAGE 4, the output of which is connected to the input of an inverter IVA.

The delay unit 28 comprises six stages, which are designated as STAGE 5 to STAGE 10. The output of the inverter IVA of STAGE 4, which produces the pulses A, is connected to a delay element DL1 of STAGE 5, the output of which is connected to an inverter IVA. The output of the inverter IVA of STAGE 5 is connected to the input of a delay element DL1 of STAGE 6, the output of which is connected through an inverter IVA to a delay element DL1 of STAGE 7.

The output of the delay element DL1 of STAGE 7 is connected through an inverter IVA to delay element DL1 of STAGE 8. The output of the delay element DL1 of STAGE 8 is connected to an inverter IVA, the output of which is connected to a delay element DL1 of STAGE 9. Another loading element, consisting of four inverters IV, is connected to the output of the delay element DL1 of STAGE 8.

In an essentially similar manner, STAGE 9 comprises a delay element DL1 and an inverter IVA. An inverting element comprising four inverters IV is connected to the output of the delay element DL1 of STAGE 9. The output of the inverter IVA of STAGE 9 is connected to a delay element DL1 of STAGE 10.

STAGE 10 does not comprise an inverter. However, STAGE 10 comprises a loading element DL that is connected to the output of the delay element DL1. The pulses B appear at the junction of the delay element DL1 and the loading element DL of STAGE 10, and are applied to the NAND gate 22.

Figure 13:
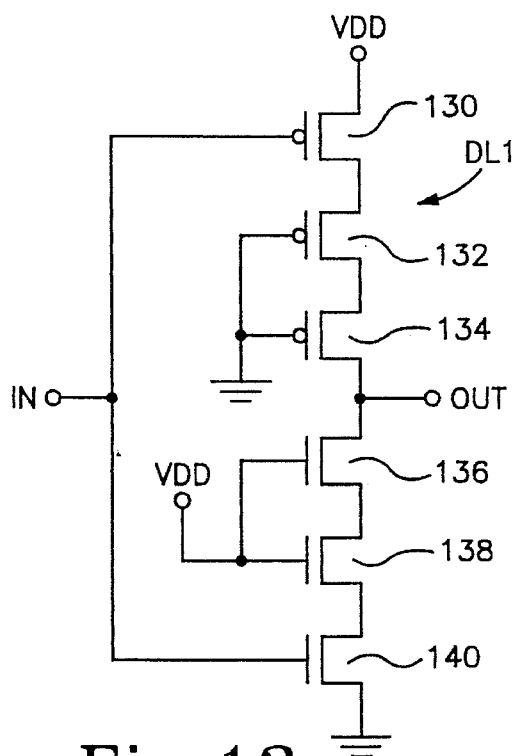
FIG. 13 is an electrical schematic diagram illustrating a first delay element of the present process monitor.
Figure 14:
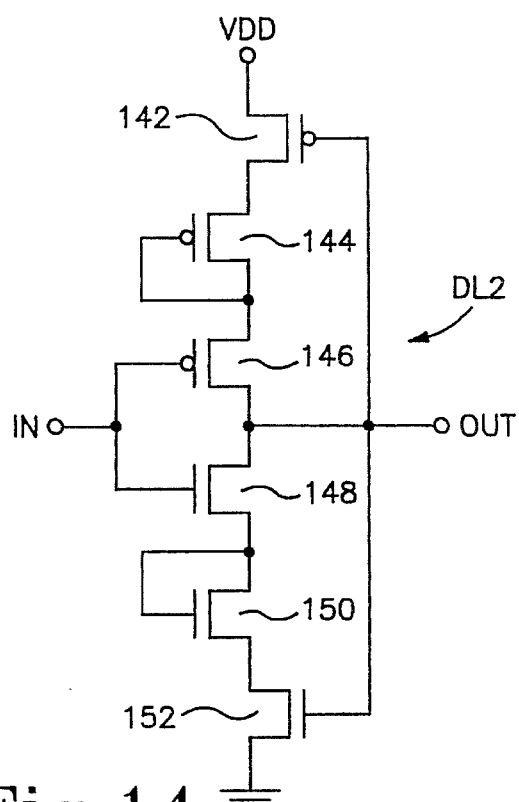
FIG. 14 is an electrical schematic diagram illustrating another delay element of the present process monitor.

The delay elements DL1 have a similar configuration that is illustrated in FIG. 13, whereas the delay elements DL2 also have a similar configuration that is illustrated in FIG. 14. However, the gate lengths and widths of the individual transistors in the delay elements DL1 and DL2 are preferably different, and are selected in accordance with the particular application using computer simulation. The method in which these gate lengths and widths are selected is not the particular subject matter of the present invention, and is preferably performed in an automated manner.

The inverters IVA are illustrated in FIG. 10, and are preferably identical. Each invertor IVA comprises a PMOS transistor 100 and an NMOS transistor 102 having their gates commonly connected to receive an input signal from the upstream element. The source of the transistor 100 and the drain of the transistor 102 are connected together to constitute an output terminal where producing an output signal to the downstream element. The drain of the transistor 100 is connected to the source VDD, whereas the source of the transistor 102 is connected to ground.

The inverter IVA is adapted to produce equal rising and falling pulse edge delays by providing an additional PMOS transistor 104 in parallel with the PMOS transistor 100. The sources, drains and gates of the transistors 100 and 104 are connected together.

The switching speed of an NMOS transistor is approximately twice that of a PMOS transistor. By providing two PMOS transistors 100 and 104 in parallel, the switching speed of the combined transistors 100 and 104, which constitute pull-up transistors, is made approximately equal to that of the NMOS transistor 102 which constitutes a pull-down transistor.

Since the pull-up and pull-down speeds are approximately equal, the inverter IVA produces output pulses which are essentially replicas of the input pulses, having substantially equal rising edge and falling edge delays.

Figure 11:
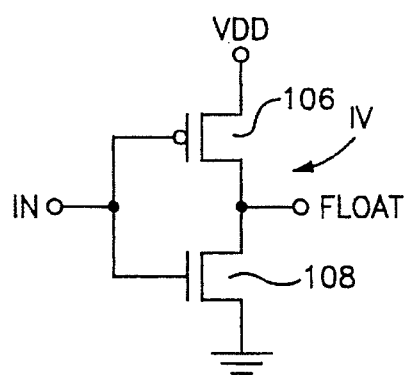
FIG. 11 is an electrical schematic diagram illustrating another inverter element of the process monitor of FIG. 9.

The delay elements IV of the loading elements are illustrated in FIG. 11. The inverters IV are similar to the inverters IVA, except that the inverters IV comprise only one PMOS transistor 106 and one NMOS transistor 108. The inputs of the transistors 106 and 108 are connected to the outputs of the corresponding delay elements, whereas the source of the transistor 106 and the drain of the transistor 108 are connected together are allowed to float. The drain of the transistor 106 is connected to the power source VDD, whereas the source of the transistor 108 is connected to ground.

Figure 12:
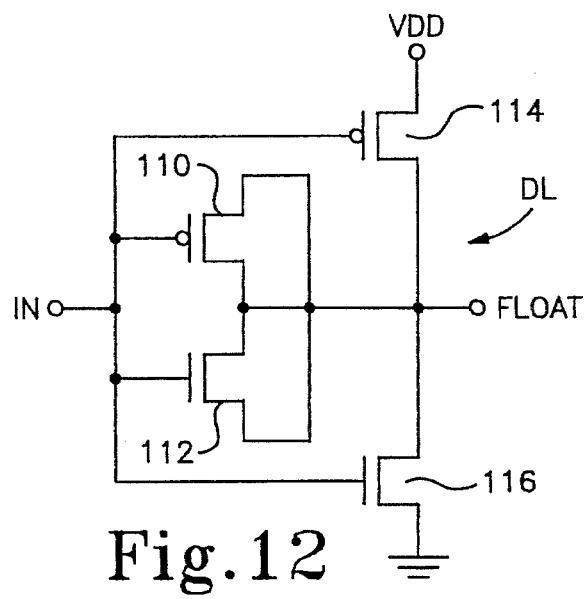
FIG. 12 is an electrical schematic diagram illustrating a loading element of the present process monitor.

The loading element DL is illustrated in FIG. 12, and comprises a PMOS pull-up transistor 114 and an NMOS pull-down transistor 116. The drain of the transistor 114 is connected to the power source VDD, whereas the source of the transistor 116 is connected to ground. The source of the transistor 114 is connected to the drain of the transistor 116, with this junction being allowed to float. The gates of the transistors 114 and 116 are commonly connected to receive, as an input, the output of the associated delay element.

The loading element DL further comprises a PMOS transistor 110 having a gate connected to receive the input signal, and a source and drain which are interconnected to the junction of the transistors 114 and 116. The loading element DL further comprises an NMOS transistor 112 having a gate connected to receive the input signal, and a source and drain that are interconnected to the junction of the transistors 114 and 116.

Figure 15:
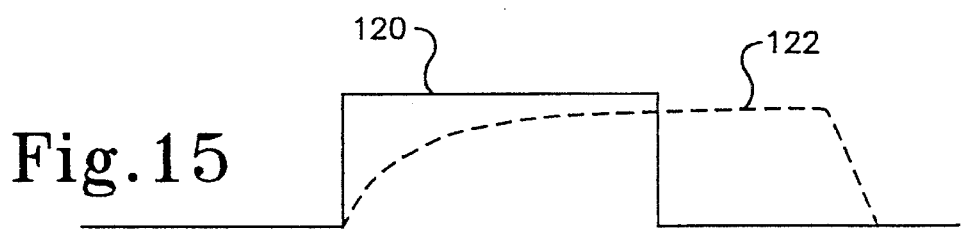
FIG. 15 is a timing diagram illustrating the loading operation of the elements of FIGS. 11 and 12.

The inverter IV and the loading element DL are designed to produce a similar effect as illustrated in FIG. 15, with the effect of the loading element DL being greater than that of the inverter IV. As illustrated in FIG. 15, an input pulse 120 is applied to the inverter IV or the loading element DL. The effect of these elements is to delay the falling edge of the input pulse 120 so that it will attain the waveform as indicated in broken line at 122.

The circuit loading produced by the inverter IV and the loading element DL increase the pulse width as illustrated in FIG. 15, therefore increasing the variation of the period Wb described above with reference to FIG. 5 in accordance with the strength of the NMOS transistors and the process monitor 20.

The configuration of the delay elements DL1 is illustrated in FIG. 13. Each delay element DL1 comprises three PMOS transistors 130, 132 and 134, and NMOS transistors 136, 138 and 140 that are connected in series between the power source VDD and ground as illustrated.

The input is connected to the gates of the transistors 130 and 140 which constitute pull-up and pull-down transistors, respectively. The gates of the transistors 132 and 134 are connected to ground, whereas the gates of the transistors 136 and 138 are connected to the power source VDD. The output of the delay element DL1 is taken at the junction of the transistors 134 and 136.

The configuration of the delay elements DL2 is illustrated in FIG. 14. Each delay element DL2 comprises PMOS transistors 142, 144, and 146, and NMOS transistors 148, 150 and 152 that are connected in series between the power source VDD and ground. The input signal is applied to the gates of the transistors 146 and 148 which constitute pull-up and pull-down transistors, respectively. The output is taken at the junction of the transistors 146 and 148.

The gate of the transistor 144 is connected to the source thereof, and the gate of the transistor 150 is connected to the drain thereof. The gates of the transistors 142 and 152 are connected to the junction of the transistors 146 and 148 that constitute the output.

The configurations of the delay elements DL1 and DL2 are selected as illustrated, such that the delay elements DL2 delay the rising edges of pulses applied thereto more than the falling edges of the pulses, to a greater extent than the delay elements DL1. This effect is the opposite of that produced by the load element DL and the inverters IV.

In summary, the oscillatory configuration of the present process monitor is highly sensitive to variations in process factor, enabling the monitor to be embodied using a much smaller number of gates than the prior art process monitor described above. This enables the present process monitor to fit into two input/output slots in a standard CMOS integrated circuit layout, thereby freeing the entire core area of the circuit for actual logical circuitry.

The reduced size of the present process monitor also results in reduced power consumption, and it can be powered from a standard CMOS integrated circuit power supply. As another benefit of the present invention, the oscillatory configuration eliminates the necessity for external test pulses as are required in the prior art process monitor.

Various modifications will become possible for those skilled in the art after receiving the teachings of the present disclosure without departing from the scope thereof. For example, the exclusive-OR gate 26 of FIG. 4 can be replaced with an exclusive-NOR gate.

I claim:

1. A process monitor for a CMOS integrated circuit, comprising:

a ring oscillator that is fabricated integrally with the integrated circuit and includes PMOS circuit elements and NMOS circuit elements; and a processor for sensing pulses generated by the ring oscillator and computing a process factor for the integrated circuit as a predetermined function of a parameter of said sensed pulses that varies in accordance with relative electrical characteristics of the PMOS circuit elements and the NMOS circuit elements.

2. A process monitor as in claim 1, in which the processor computes said process factor in accordance with a frequency of said pulses.

3. A process monitor as in claim 1, in which the processor senses said pulses at different points in the ring oscillator and computes said process factor in accordance with a delay between edges of said pulses at said points.

4. A process monitor as in claim 3, in which the processor computes said process factor as comprising a ratio of a delay between rising edges of said pulses at said points and a delay between falling edges of said pulses at said points.

5. A process monitor as in claim 1, in which:

the ring oscillator comprises first and second delay units that are interconnected in a ring; and the processor senses said pulses at outputs of the first and second delay units and computes said process factor in accordance with a delay between edges of said pulses at said outputs.

6. A process monitor as in claim 5, in which the processor comprises an exclusive-OR unit having inputs connected to said outputs respectively.

7. A process monitor as in claim 5, in which the processor computes said process factor as comprising a ratio of a delay between rising edges of said pulses at said outputs and a delay between falling edges of said pulses at said outputs.

8. A process monitor as in claim 7, in which:

the first delay unit imparts a rising edge delay to said pulses that is relatively sensitive to variations in said electrical characteristics of the PMOS circuit elements; and the second delay unit imparts a rising edge delay to said pulses that is relatively insensitive to variations in said electrical characteristics of the PMOS circuit elements.

9. A process monitor as in claim 8, in which the first delay unit comprises delays said rising edges more than said falling edges.

10. A process monitor as in claim 7, in which:

the second delay unit imparts a falling edge delay to said pulses that is relatively sensitive to variations in said electrical characteristics of the NMOS circuit elements; and the first delay unit imparts a falling edge delay to said pulses that is relatively insensitive to variations in said electrical characteristics of the NMOS circuit elements.

11. A process monitor as in claim 10, in which the second delay unit delays said falling edges more than said rising edges.

12. A method of determining a process factor for a CMOS integrated circuit, comprising the steps of:

(a) providing a ring oscillator that is fabricated integrally with the integrated circuit and includes PMOS circuit elements and NMOS circuit elements;

(b) sensing pulses generated by the ring oscillator; and (c) computing said process factor as a predetermined function of a parameter of said sensed pulses that varies in accordance with relative electrical characteristics of the PMOS circuit elements and the NMOS circuit elements.

13. A method as in claim 12, in which step (c) comprises computing said process factor as a predetermined function of a frequency of said pulses.

14. A method as in claim 12, in which:

step (b) comprises sensing said pulses at different points in the ring oscillator; and step (c) comprises computing said process factor as a predetermined function of a delay between edges of said pulses at said points.

15. A method as in claim 14, in which step (c) comprises computing said process factor as comprising a ratio of a delay between rising edges of said pulses at said points and a delay between falling edges of said pulses at said points.

16. A method as in claim 12, in which:

step (a) comprises providing the ring oscillator as comprising first and second delay units that are interconnected in a ring;

step (b) comprises sensing said pulses at outputs of the first and second delay units; and step (c) comprises computing said process factor as a predetermined function of a delay between edges of said pulses at said outputs.

17. A method as in claim 16, in which step (c) comprises performing an exclusive-OR operation on said pulses.

18. A method as in claim 16, in which step (c) comprises computing said process factor as comprising a ratio of a delay between rising edges of said pulses at said outputs and a delay between falling edges of said pulses at said outputs.

19. A CMOS integrated circuit, comprising:

a semiconductor substrate;

a plurality of CMOS circuit elements formed on the substrate; and a process monitor formed on the substrate, including:

a ring oscillator that is fabricated integrally with the CMOS circuit elements and includes PMOS circuit elements and NMOS circuit elements; and a processor for sensing pulses generated by the ring oscillator and computing a process factor for the integrated circuit as a predetermined function of a parameter of said sensed pulses that varies in accordance with relative electrical characteristics of the PMOS circuit elements and the NMOS circuit elements.

20. An integrated circuit as in claim 19, in which the processor computes said process factor in accordance with a frequency of said pulses.

21. An integrated circuit as in claim 19, in which the processor senses said pulses at different points in the ring oscillator and computes said process factor in accordance with a delay between edges of said pulses at said points.

22. An integrated circuit as in claim 21, in which the processor computes said process factor as comprising a ratio of a delay between rising edges of said pulses at said points and a delay between falling edges of said pulses at said points.

23. An integrated circuit as in claim 19, in which:

the ring oscillator comprises first and second delay units that are interconnected in a ring; and the processor senses said pulses at outputs of the first and second delay units arid computes said process factor in accordance with a delay between edges of said pulses at said outputs.

24. An integrated circuit as in claim 23, in which the processor comprises an exclusive-OR unit having inputs connected to said outputs respectively.

25. An integrated circuit as in claim 23, in which the processor computes said process factor as comprising a ratio of a delay between rising edges of said pulses at said outputs and a delay between falling edges of said pulses at said outputs.

26. An integrated circuit as in claim 25, in which:

the first delay unit imparts a rising edge delay to said pulses that is relatively sensitive to variations in said electrical characteristics of the PMOS circuit elements; and the second delay unit imparts a rising edge delay to said pulses that is relatively insensitive to variations in said electrical characteristics of the PMOS circuit elements.

27. An integrated circuit as in claim 26, in which the first delay unit delays said rising edges more than said falling edges.

28. An integrated circuit as in claim 27, in which:

the second delay unit imparts a falling edge delay to said pulses that is relatively sensitive to variations in said electrical characteristics of the NMOS circuit elements; and the first delay unit imparts a falling edge delay to said pulses that is relatively in insensitive to variations in said electrical characteristics of the NMOS circuit elements.

29. An integrated circuit as in claim 28, in which the second delay unit delays said falling edges more than said rising edges.

* * * * *